(12) United States Patent
Riedel

(10) Patent No.: US 6,316,865 B1
(45) Date of Patent: Nov. 13, 2001

(54) PIEZOELECTRIC ELEMENT

(75) Inventor: Michael Riedel, Rödental (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/539,245

(22) Filed: Mar. 30, 2000

Related U.S. Application Data

(63) Continuation of application No. PCT/DE98/02810, filed on Sep. 22, 1998.

(30) Foreign Application Priority Data

Sep. 30, 1997 (DE) ............................................. 197 43 332

(51) Int. Cl.$^7$ ................................................. H01L 41/08
(52) U.S. Cl. ........................ 310/332; 310/359; 310/366
(58) Field of Search ................................... 310/330–332, 310/328, 366, 359

(56) References Cited

U.S. PATENT DOCUMENTS

| | | | |
|---|---|---|---|
| 4,349,762 | * 9/1982 | Kitamura et al. | 310/332 |
| 4,363,993 | * 12/1982 | Nishigani et al. | 310/332 |
| 4,610,426 | * 9/1986 | Brandner | 310/332 X |
| 4,649,313 | 3/1987 | Ogawa et al. | |
| 5,233,256 | * 8/1993 | Hayashi et al. | 310/332 X |
| 5,404,067 | 4/1995 | Stein et al. | |

FOREIGN PATENT DOCUMENTS

| | | |
|---|---|---|
| 293 918 A5 | 10/1983 | (DE) . |
| 35 18 055 A1 | 11/1985 | (DE) . |
| 34 34 726 C2 | 12/1989 | (DE) . |
| 195 20 796 A1 | 12/1996 | (DE) . |
| 0 591 885 A2 | 4/1994 | (EP) . |

OTHER PUBLICATIONS

Japanese Patent Abstract No. 60178677 (Naoyuki), dated Sep. 12, 1985.
"Piezoelektrische Lineare Stellenantriebe" (Pfeifer), dated Jun. 1982, ISSN 0323–6374, Wissenschaftliche Schriftenreihe der Technischen Hochschule, pp. 1–57, pertains to piezoelectric linear actuating drives.

* cited by examiner

*Primary Examiner*—Mark O. Budd
(74) *Attorney, Agent, or Firm*—Herbert L. Lerner; Laurence A. Greenberg; Werner H. Stemer

(57) ABSTRACT

A piezoelectric element has a first and a second stack containing a plurality of piezoelectric ceramic layers and has an intermediate layer disposed between the first and the second stacks. The intermediate layer is formed as a supporting body made of a fiber composite material or glass. Such a multimorphous piezoelectric element exhibits a high efficiency and a high mechanical stability and, in addition, can be operated with low voltages.

10 Claims, 2 Drawing Sheets

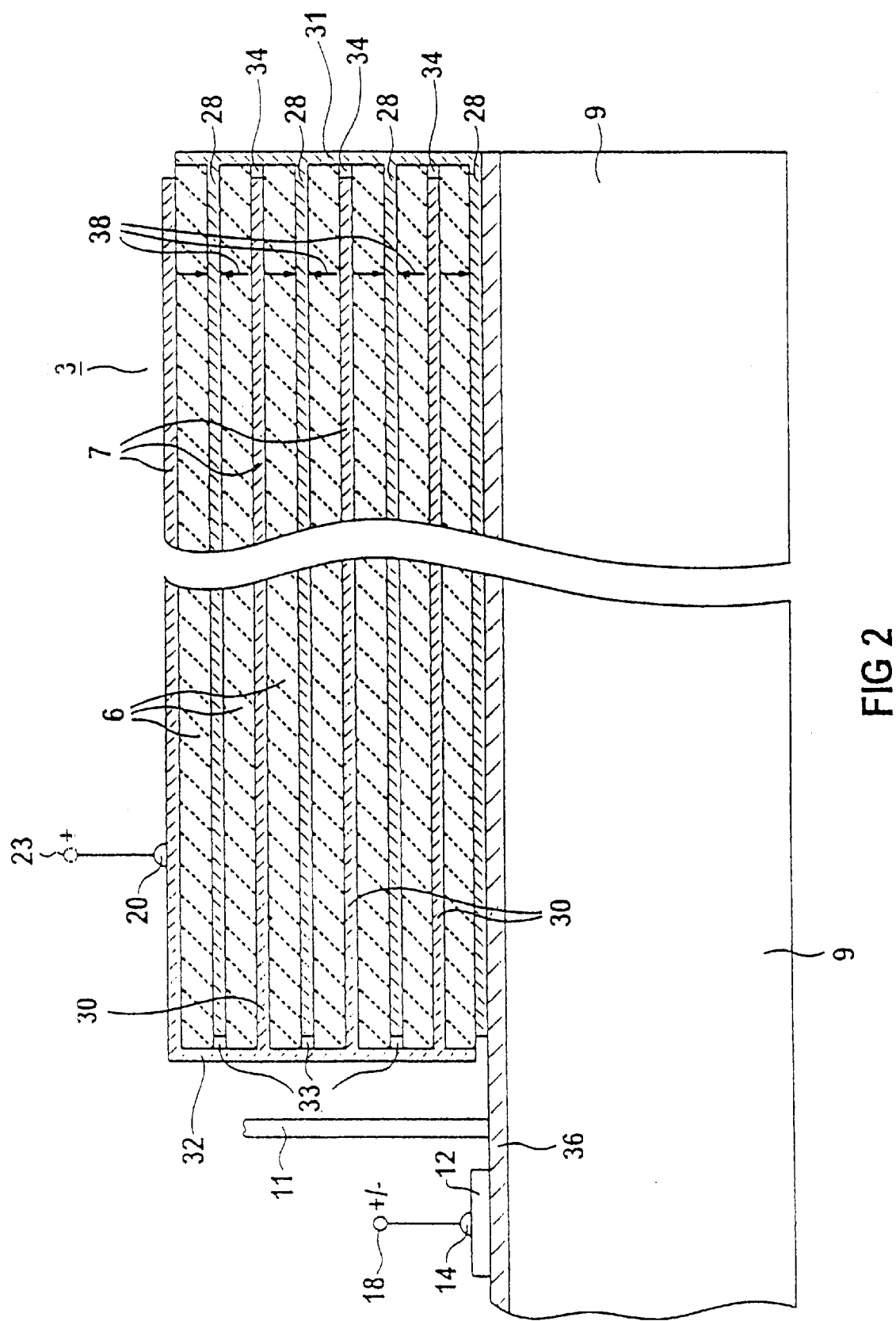

PIEZOELECTRIC ELEMENT

CROSS REFERENCE TO RELATED APPLICATION

This is a continuation of copending International Application PCT/DE98/02810, filed Sep. 22, 1998, which designated the United States.

BACKGROUND OF THE INVENTION

Field of the Invention

The invention relates to a piezoelectric element having a first and a second stack containing a plurality of piezoelectric ceramic layers and having an intermediate layer disposed between the first and second stacks. Electrodes are disposed in each stack between the respective ceramic layers and on the respective outer side of the ceramic layers bounding the stack.

A piezoelectric element of this type is disclosed in Published, Non-Prosecuted German Patent Application DE 35 18 055 A1 and in German Patent DE 34 34 726 C2. In order to operate the piezoelectric element, the electrodes have a voltage applied to them in such a way that the piezoelectric ceramic layers of the first stack respectively expand, while the piezoelectric ceramic layers of the second stack respectively contract, or vice versa. This leads to the bending of the piezoelectric element, which can be utilized to operate a mechanical or electrical switch. The intermediate layer disposed between the two stacks is likewise a ceramic layer, but this itself does not execute any active movement. For this purpose, the ceramic of the intermediate layer is either unpolarized and is consequently not piezoelectrically active, or else it is not subjected to any electric field when the piezoelectric element is driven. The intermediate layer serves to balance out the opposite movements of the two stacks and therefore increases the service life of the piezoelectric element.

A piezoelectric element that contains a large number of ceramic layers stacked on one another is also referred to as a so-called multimorphous piezoelectric element. By contrast with this, a piezoelectric element in which the stacks are replaced by a single coherent ceramic layer is referred to as a bimorphous or as a trimorphous piezoelectric element, depending on whether an intermediate layer is disposed between the two ceramic layers or not. A multimorphous piezoelectric element offers the advantage, by comparison with a bimorphous or trimorphous piezoelectric element, that the same mechanical energy is provided at a lower applied voltage. The reason for this is that the individual ceramic layers of a multimorphous piezoelectric element have a significantly lower thickness than the ceramic layers of a comparable bimorphous or trimorphous piezoelectric element, so that at the same voltage a higher electrical field is established in accordance with $E = U/d$, E indicating the electrical field, U the applied voltage and d the thickness of the ceramic layer.

Moreover, Published, Japanese Patent Application JP 60-178677 A2 discloses a piezoelectric multimorphous element, the material of the intermediate layer differs from the material of the ceramic layers.

However, because of the many, comparatively thin individual ceramic layers stacked on one another, a multimorphous piezoelectric element disadvantageously exhibits a high susceptibility to fracture and a comparatively low mechanical stability. Therefore, under load, mutual drift of the individual layers often occurs. Furthermore, a multimorphous piezoelectric element, by comparison with a bimorphous or trimorphous piezoelectric element, exhibits a lower efficiency. In addition, its production entails higher costs.

For the aforementioned reasons, hitherto preference was given to a bimorphous or trimorphous piezoelectric element in technical applications, although a multimorphous piezoelectric element may be operated with a lower voltage. Technical applications for a piezoelectric element are, for example, as a piezoelectric printing head for an ink jet printer, as a sound pick-up or generator for a microphone or a loudspeaker, as a sensor for measuring acceleration or pressure, as a measured value pick-up for gas meters and in particular as a flexural transducer, for example as an actuating element in Braille lines, in readers for blind persons, in textile machines, in pneumatic valves, in recording measuring instruments or in non-contacting surface measuring instruments and so on. In this case, a low operating voltage would permit the use of the piezoelectric element even in locations at risk of explosion, such as in the chemical industry or in mining.

SUMMARY OF THE INVENTION

It is accordingly an object of the invention to provide a piezoelectric element which overcomes the above-mentioned disadvantages of the prior art devices of this general type, in which a multimorphous piezoelectric element which, by comparison with a bimorphous or trimorphous piezoelectric element, has the advantage of a lower operating voltage.

With the foregoing and other objects in view there is provided, in accordance with the invention, a piezoelectric element, including:

two stacks, including a first stack and a second stack, each of the stacks having a plurality of piezoelectric ceramic layers and electrodes disposed between the ceramic layers and on an outer side of the ceramic layers bounding each of the stacks, the ceramic layers formed of a given material; and an intermediate layer disposed between the first stack and the second stack, the intermediate layer formed as a supporting body made of a material selected from the group consisting of a fiber composite material and glass, the material of the intermediate layer differing from the given material of the ceramic layers.

The fact that the intermediate layer is formed as a supporting body made of a fiber composite material or glass provides a multimorphous piezoelectric element made of a material composite which, by comparison with a multimorphous piezoelectric element which is purely ceramic, apart from the electrodes, has a significantly higher mechanical stability. An intermediate layer of this type serves not only to equalize stresses but in addition performs a load-bearing and supporting function for the entire piezoelectric element.

The use of a supporting body made of the fiber composite material or glass for a multi-morphous piezoelectric element also results in that the efficiency of the conversion of electrical into mechanical energy is improved. Replacing part of the ceramic material of a multimorphous piezoelectric element by such a supporting body significantly reduces the susceptibility to fracture of the piezoelectric element, which offers an inestimable advantage, in particular during installation or during operation. In addition to this, production costs are saved in this way, since piezoceramic material, in particular the multi-layer material of a multimorphous piezoelectric element, is comparatively expensive.

The invention provides a multimorphous piezoelectric element which may be driven with low voltages, has a high efficiency, has a low susceptibility to fracture with, at the same time, a high mechanical stability and, because of the improved efficiency, manages with less of the comparatively expensive ceramic multi-layer material than a comparable purely ceramic multimorphous piezoelectric element. A ceramic multi-layer material in this case refers to that material which is composed of ceramic layers (polarized or not) stacked one above another and electrodes disposed in between, for example in the form of a metalization.

A saving in ceramic multi-layer material, with simultaneous enhancement of the mechanical stability and of the efficiency of the piezoelectric element, may advantageously be achieved by the thickness of the supporting body being selected to be greater than the thickness of an individual ceramic layer in a stack or in the ceramic multi-layer material. In this connection, it has been shown in particular that the piezoelectric element has excellent properties if the thickness of the supporting body is essentially equal to the respective thickness of a stack. In this way, in particular by comparison with a purely ceramic multimorphous piezoelectric element, it is possible to save up to one third of the material costs for the ceramic multi-layer material.

During production, the fiber composite material is used in the form of a so-called prepreg (a not yet cured, soft, pre-impregnated blank). For the purpose of production, simply the first stack, the supporting body in the form of the prepreg and the second stack are placed loosely on one another, are subsequently compressed under pressure and adhesively bonded to one another by a heat treatment, curing the prepreg.

In a further advantageous refinement of the invention, the fiber composite material is an epoxy resin reinforced with carbon or glass fibers. This increases the mechanical stability and fracture strength.

If the supporting body consists of glass, the two stacks of piezoelectric ceramic layers or ceramic multi-layer material are bonded to the supporting body by a suitable adhesive.

In order to be able to operate the piezoelectric element with a lower operating voltage and with a high efficiency, it is expedient for the thickness of the ceramic layers in each case to be between 20 and 40 $\mu$m and for the thickness of the supporting body to be between 100 and 1000 $\mu$m. Given such thicknesses of the individual ceramic layers, operating voltages between 20 and 80 volts are sufficient to achieve field strengths of greater than 1 kV/mm. Such field strengths are necessary in order to obtain an adequately great actuating or bending force when the piezoelectric element is used as an actuating or bending element.

The multimorphous piezoelectric element can, then, in principle be driven in two variants. In the first variant, all the ceramic layers of a stack are polarized parallel to one another and along the stack direction. This is achieved, for example, by applying a directed, homogeneous electrical field of a few kV/mm. A piezoelectric element of this type is driven by the applied voltage in each case decreasing and increasing respectively by the same amount from electrode to electrode within a stack. In this way, each individual piezoelectric ceramic layer of a stack sees the same electrical field, but at a different level. Accordingly, all the driven piezoelectric ceramic layers of a stack execute the same movement, that is to say either they contract or they expand. In order to bend the piezoelectric element, provision can then be made for the ceramic layers of a stack to contract, while the ceramic layers of the other stack expand, or only one stack is driven, while the ceramic layers of the other stack do not execute any movement.

The latter has the advantage that the piezoelectric ceramic layers do not have to have an electrical field applied counter to their direction of polarization. This is because if a voltage is applied counter to the direction of polarization, only a voltage up to at most one half of the coercivity field strength can be applied, since otherwise depolarization of the piezoelectric ceramic occurs, which entails a reduction in the piezoelectric effect. However, in the case of driving in this way, the voltages applied to an individual ceramic layer add up to a not inconsiderable total voltage, corresponding to the number of ceramic layers in a stack. In addition, contact must be made separately with each individual electrode of a stack, since each of the electrodes is at a different potential.

Therefore, the second driving variant is rather to be preferred, for which purpose adjacent ceramic layers of a stack are polarized in respectively opposite directions, but likewise parallel to the stack direction. In order to drive such a multimorphous piezoelectric element, a potential difference of the same level but with a different sign is applied to the electrodes of adjacent ceramic layers. In this way, adjacent ceramic layers have applied to them an electrical field of identical magnitude but different direction. As considered in the stack direction, each second electrode is therefore at the same potential. It is therefore expedient to subdivide the electrodes of each stack in each case into a first and into a second group of electrically connected electrodes in such a way that adjacent electrodes are each assigned to the other group. For the purpose of driving, the first group of electrically connected electrodes is then connected to one pole and the second group of electrically connected electrodes is connected to the other pole of a voltage source. The voltage source needs to supply a relatively low voltage in this case, which is adequate to generate the necessary electrical driving field in accordance with the low thickness of an individual ceramic layer. As already mentioned, this voltage is around 20 to 80 volts at a layer thickness of the ceramic layers of 20 to 40 $\mu$m.

In an advantageous refinement of the invention, the electrodes of the first and the second group of a stack have electrical contact made between them in each case by a first and a second edge electrode, the first and the second edge electrodes being disposed on opposite side faces of the respective stack, and the electrodes of the first and the second group in each case being electrically insulated from the second and the first edge electrode respectively. In a cross section transverse to the stack direction, the electrodes of such a stack appear like two interengaging combs. In this case, it is particularly advantageous if the piezoelectric ceramic layers of a stack are present in an odd number. This is because in this way the two outer electrodes of the stack belong to two different groups, so that a stack of this type containing piezoelectric ceramic layers can be activated in the same way, by applying a voltage to the outer electrodes, as a unified piezoceramic of identical thickness to which voltage is likewise applied via the outer electrodes. However, the operating voltage needed to activate the unified piezoceramic is many times the operating voltage needed to activate the stack.

In order to make contact with such a piezoelectric element, the stacks in each case being formed of an odd number of piezoelectric ceramic layers and the electrodes being combined in the aforementioned way, three electrical contacts are expediently provided. Here, the outer electrode of the first stack has a first contact, the outer electrode of the second stack has a second contact and the two inner electrodes, resting directly on the supporting body, of the first and of the second stack have a common third contact. The common third contact can be disposed, for example, on the supporting body itself, if the latter is electrically conductive.

Otherwise, the supporting body can be provided with a conductive coating. For the purpose of connection to a voltage source, appropriate connecting cables are simply connected, via the contacts, to the piezoelectric element. For this purpose, the contacts can consist, for example, of a solderable material.

For the purpose of driving, then, the first and the second contacts are connected to the opposite poles of a DC source. The contact that is common to the two inner electrodes then has a voltage applied to it, via a controllable voltage source, alternately, once with the one potential and once with the other potential of the two poles. In this connection, in particular when connecting the first and the second contact, care must be taken that the electrical field which forms within each individual piezoelectric ceramic layer points in the direction of polarization. When it is driven in this way, in each case only one stack has a voltage applied to it and, as a result, is activated. The respective other stack remains inactive. Depending on the voltage applied to the third contact, bending of the piezoelectric element occurs, once in one direction and once in the other direction. Here, each individual piezoelectric ceramic layer always sees an electrical field in the direction of the respective polarization when it is activated. In this way, deactivation of the piezoelectric element is reliably avoided.

For a particularly good conversion of electrical to mechanical energy, it is advantageous if the area of the supporting body is greater than the contact area of the stacks, so that a free part of the supporting body extends beyond the stacks. In this way, the actuating or deflecting travel of the piezoelectric element can be increased via the lever action of the supporting body.

The third contact for making common contact with the inner electrodes of the first and the second stack is advantageously made via a metal foil, in particular a copper foil, which is at least partly applied to the free part of the supporting body and which is suitable to have a solder contact fitted. In this case, either in the case of a conductive or in the case of an electrically insulating supporting body provided with a conductive coating, the metal foil can be applied only to the free part of the supporting body or, in the case of an electrically insulating supporting body, can be inserted partially between the supporting body and the respective inner electrode of the stacks.

Other features which are considered as characteristic for the invention are set forth in the appended claims.

Although the invention is illustrated and described herein as embodied in a piezoelectric element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 a fragmented, enlarged, cross-sectional view according to FIG. 1, of the supporting body being provided with a conductive coating.

DESCRIPTION OF THE PREFERRED EMBODIMENTS

Figure 1:
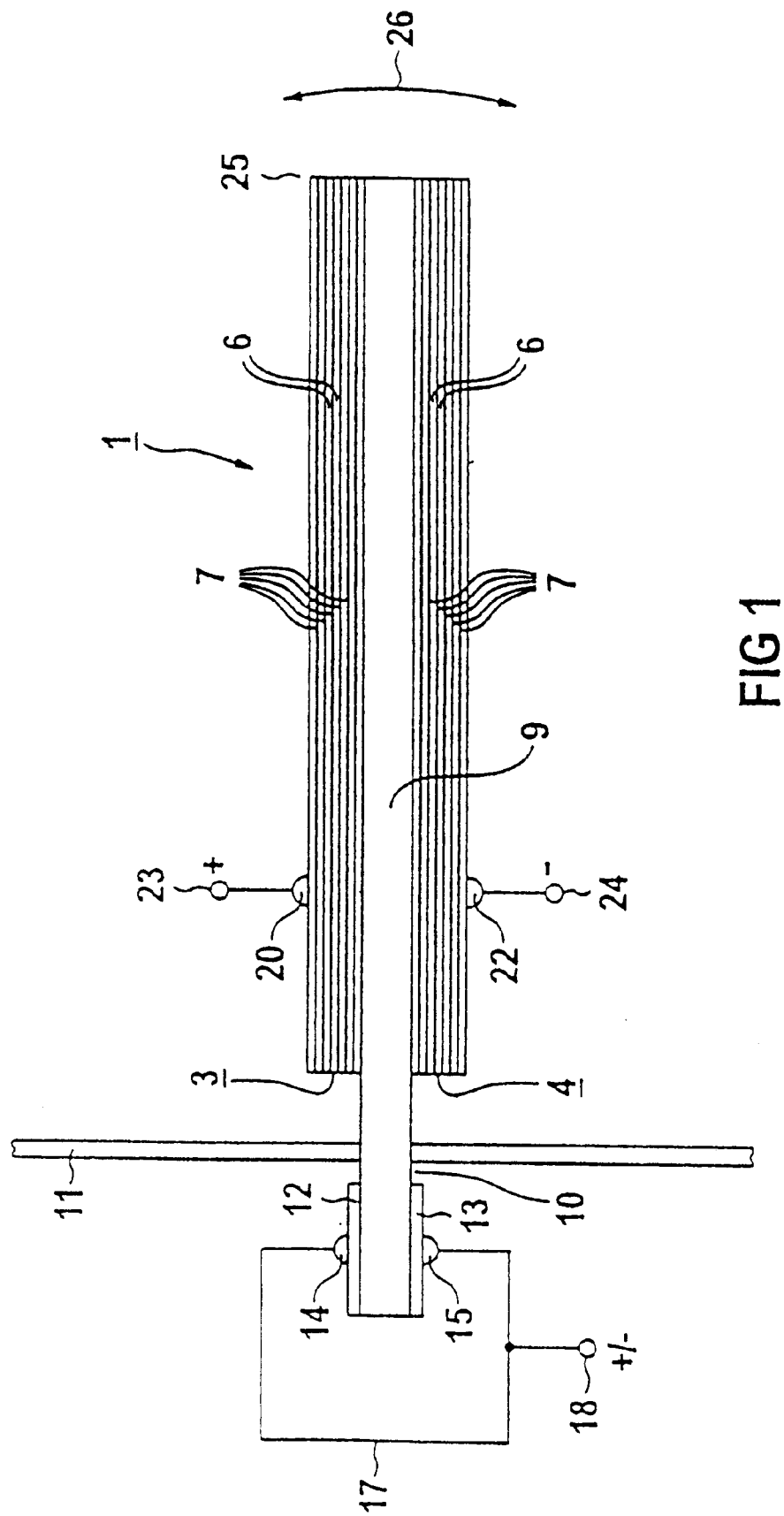
FIG. 1 is a diagrammatic, cross-sectional view through a multimorphous piezoelectric element configured as a flexural transducer having a supporting body and according to the invention.

In all the figures of the drawing, sub-features and integral parts that correspond to one another bear the same reference symbol in each case. Referring now to the figures of the drawing in detail and first, particularly, to FIG. 1 thereof, there is shown a cross-sectional view of a piezoelectric element 1, formed as a flexural transducer, having a first stack 3 and a second stack 4. Each of the first and second stacks 3, 4 contains a number of ceramic layers 6 stacked on one another with electrodes 7 disposed between them and on the bounding outer sides. The two stacks 3, 4 are applied to both sides of a supporting body 9, which consists of an epoxy resin reinforced with carbon fiber and is consequently electrically conductive. The supporting body 9 has a larger area than the contact area of the two stacks 3, 4 so that a free part 10 extends beyond the stacks 3, 4. The free part 10 of the supporting body 9 is clamped in a holder 11, which is shown only schematically here. It is likewise possible to clamp that part of the supporting body 9 to which the stacks are applied in the holder 11.

To make electrical contact with the piezoelectric element 1, copper foils 12, 13 are applied to both sides of the free end of the supporting body 9. Here, the copper foils 12, 13 are either adhesively bonded to the supporting body 9 or are connected to the latter during the curing operation of the epoxy resin of the supporting body 9. Via the two copper foils 12, 13, the supporting body 9 is connected, with the aid of the two solder contacts 14, 15 and via the connecting wire 17, to a terminal 18 which can be switched to a positive and negative potential of a DC source. In addition, the outer electrode of the first stack 3 is connected via a solder contact 20 to a positive pole 23 of the DC source. The outer electrode of the second stack 4 is connected via the solder contact 22 to a negative pole 24 of the DC source.

According to the configuration shown in more detail in FIG. 2 of the electrodes 7 within the stacks 3, 4, if they are wired up in this way, the electrodes 7 along the stack direction are connected alternately once via a respective outer electrode to the positive pole 23 and the negative pole 24, respectively, and once via the supporting body 9 to the switchable terminal 18 of the DC source. If the switchable terminal 18 is now brought to the potential of the positive pole 23, an electrical field is generated in the ceramic layers 6 of the second stack 4, while no electrical field is built up in the ceramic layers 6 of the first stack 3. With the opposite polarization (shown in more detail in FIG. 2) of successive ceramic layers, this leads to a contraction of all the ceramic layers 6 in the second stack 4; a further free end 25 of the flexural transducer is moved downward along the arrow shown. In a corresponding way, the further free end 25 of the piezoelectric element 1 moves upward along the arrow shown if the switchable terminal 18 of the DC source is brought to the potential of the negative pole 24.

FIG. 2 shows in more detail, in a detailed enlargement, the construction of the piezoelectric element 1 according to FIG. 1. In this case, however, the supporting body 9 is not made, as illustrated in FIG. 1, of a carbon-fiber reinforced epoxy resin but of a glass-fiber reinforced epoxy resin and is consequently electrically nonconductive. For reasons of clarity, the second stack 4 is not shown in FIG. 2. However, the second stack 4 is configured in the same way as the illustrated first stack 3.

In the illustrated piezoelectric element 1 according to FIG. 2, the electrodes 7 of the stack 3 and, in the same way, the electrodes of the stack 4 are subdivided into a first group 28 and a second group 30 of electrodes which are in each case connected electrically. The electrodes 7 of the first group 28 are in each case electrically interconnected by a first edge electrode 31 disposed at one end of the stack 3, and the electrodes 7 of the second group 30 are in each case electrically interconnected via a second edge electrode 32 disposed at the opposite end of the stack 3. The two edge electrodes 31, 32 are applied in this case in the form of a metalization to the ends of the stack 3 and of the stack 4. The electrodes of the first group 28 are electrically insulated from the second edge electrode 32 by their lengths being shortened with respect to the length of the stack 3, so that in each case a gap 33 is produced between the second edge electrode 32 and the electrodes of the first group 28. The same applies to the electrodes of the second group 30, a gap 34 being produced in each case between the first edge electrode 31 and the electrodes of the second group 30. The ceramic layers 6 are in each case disposed between the electrodes 7, respectively adjacent the ceramic layers 6 having an opposite polarization in accordance with the arrows shown in FIG. 2. Each of the stacks 3, 4 has an odd number of ceramic layers 6. In the case shown, each stack has seven of the ceramic layers 6.

The stacks 3, 4, built up in the manner shown from successive piezoelectric ceramic layers, can be driven in the same way as an individual coherent piezoelectric ceramic layer with external electrodes. To be specific, if the two outer electrodes of the stack 3, 4 have a voltage applied to them, an electrical field is generated in each individual ceramic layer 6, the electrical fields of adjacent ceramic layers each pointing in opposite directions. Since the directions of polarization of adjacent ceramic layers also point in opposite directions, each individual one of the ceramic layers 6 of the stack is driven in the same way. In each case, the electrical field points in the same direction as the polarization.

For the piezoelectric element 1 illustrated in FIG. 2, making contact with an inner electrode, facing the supporting body 9, of the first stack 3 (the same of course applies for the non-illustrated second stack 4) is ensured via a conductive coating 36 additionally applied to the supporting body 9. The copper foil 12 is applied to the conductive coating 36 at the free end 10 of the supporting body 9 and is connected to the switchable terminal 18 of the DC source via the solder contact 14.

If the switchable terminal 18 of the DC source has the potential of the negative pole applied to it, then all the electrodes of the first group 28 are connected to the negative pole. On the other hand, the electrodes of the second group 30 are connected to the positive pole 23 of the DC source via the outer electrode, by the solder contact 20. In this way, an electrical field is generated in each ceramic layer 6 in the same direction as the respective polarization (see the arrows shown). Accordingly, all the ceramic layers 6 of the first stack 3 contract perpendicular to the direction of the electrical field, that is to say the first stack 3 is shortened along the direction of the supporting body 9. Consequently, the supporting body 9 bends upward.

I claim:

1. A piezoelectric element, comprising:
   two stacks, including a first stack and a second stack, each of said stacks having a plurality of piezoelectric ceramic layers each having a given thickness and electrodes disposed between said ceramic layers and on an outer side of said ceramic layers bounding each of said stacks, said ceramic layers formed of a given material; and
   an intermediate layer formed as a supporting body between said first stack and said second stack, said supporting body made of a material selected from the group consisting of a fiber composite material and glass, said material of said supporting body differing from said given material of said ceramic layers, and said supporting body having a thickness greater than said given thickness of each of said ceramic layers individually.

2. The piezoelectric element according to claim 1, wherein said fiber composite material is an epoxy resin reinforced with one of carbon fibers and glass fibers.

3. The piezoelectric element according to claim 1, wherein said ceramic layers each have a given thickness between 20 and 40 µm, and said supporting body has a thickness of between 100 and 1000 µm.

4. The piezoelectric element according to claim 1, wherein said electrodes of said stacks are in each case subdivided into a first group and a second group of electrically connected electrodes connected such that adjacent electrodes are each assigned to the other group, and that adjacent ceramic layers each have opposed directions of polarization parallel to a stack direction.

5. The piezoelectric element according to claim 4, including a first edge electrode electrically connecting said electrodes of said first group and a second edge electrode electrically connecting said electrodes of said second group, said first edge electrode and said second edge electrode disposed on opposite side faces of a respective stack, and said electrodes of said first group being electrically insulated from said second edge electrode and said electrodes of said second group being electrically insulated from said first edge electrode.

6. The piezoelectric element according to claim 5, wherein said electrodes of said first group are shortened in a direction of said second edge electrode for electrical insulation, and said electrodes of said second group are shortened in a direction of the first edge electrode for electrical insulation.

7. The piezoelectric element according to claim 4, wherein each of said stacks has an odd number of said ceramic layers, said first stack having a first electrical contact disposed on an electrode disposed on said outer side of said first stack, said second stack having a second electrical contact disposed on an electrode disposed on said outer side of said second stack, and said supporting body having a common third electrical contact disposed on said electrodes resting directly on said supporting body, said first electrical contact and said second electrical contact in each case making electrical contact with said second group of said electrodes, and said common third contact making electrical contact with said first group of said electrodes.

8. The piezoelectric element according to claim 1, wherein each of said stacks have a contact area making contact with said supporting body, and said supporting body has a given area greater than said contact area of each of said stacks, resulting in a free part of said supporting body extending beyond said stacks.

9. The piezoelectric element according to claim 8, including a metal foil at least partly applied to said free part of said supporting body and which is suitable for having a solder contact fitted thereon, said metal foil provided for making contact with said electrodes disposed between said supporting body and said stacks.

10. The piezoelectric element according to claim 9, wherein said metal foil is a copper foil.

* * * * *